United States Patent
Okamura et al.

(10) Patent No.: US 10,381,246 B2
(45) Date of Patent: Aug. 13, 2019

(54) SUBSTRATE PROCESSING APPARATUS

(71) Applicant: Tokyo Electron Limited, Tokyo (JP)

(72) Inventors: Satoshi Okamura, Kumamoto (JP); Satoshi Biwa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/806,481

(22) Filed: Nov. 8, 2017

(65) Prior Publication Data
US 2018/0138060 A1 May 17, 2018

(30) Foreign Application Priority Data
Nov. 16, 2016 (JP) .................. 2016-223277

(51) Int. Cl.
| B08B 3/08 | (2006.01) |
| B08B 7/00 | (2006.01) |
| H01L 21/02 | (2006.01) |
| H01L 21/67 | (2006.01) |
| H01L 21/677 | (2006.01) |

(52) U.S. Cl.
CPC ...... *H01L 21/67051* (2013.01); *B08B 7/0021* (2013.01); *H01L 21/6719* (2013.01); *H01L 21/67126* (2013.01); *H01L 21/67748* (2013.01); *B08B 3/08* (2013.01); *H01L 21/02057* (2013.01); *H01L 21/02101* (2013.01)

(58) Field of Classification Search
CPC ... B08B 3/08; B08B 7/0021; H01L 21/02057; H01L 21/02101; H01L 21/67051; H01L 21/67126; H01L 21/6719; H01L 21/67748
USPC ........ 134/56 R, 57 R, 95.1, 95.2, 95.3, 99.1, 134/102.2, 133, 902
See application file for complete search history.

(56) References Cited

FOREIGN PATENT DOCUMENTS

| JP | 2013-012538 A | 1/2013 |
| JP | 2013-016798 A | 1/2013 |

OTHER PUBLICATIONS

Ono et al., "JP2013012538A English Machine Translation.pdf", Jan. 17, 2013—Machine translation from Espacenet.com.*

* cited by examiner

*Primary Examiner* — Levon J Shahinian
(74) *Attorney, Agent, or Firm* — Abelman, Frayne & Schwab

(57) ABSTRACT

Disclosed is a substrate processing apparatus including: a container body configured to accommodate a substrate and perform a processing on the substrate using a high-pressure processing fluid; a conveyance port configured to carry the substrate into and out of the container body; an opening formed in the container body at a position different from the conveyance port; and a cover member configured to close the opening.

12 Claims, 10 Drawing Sheets

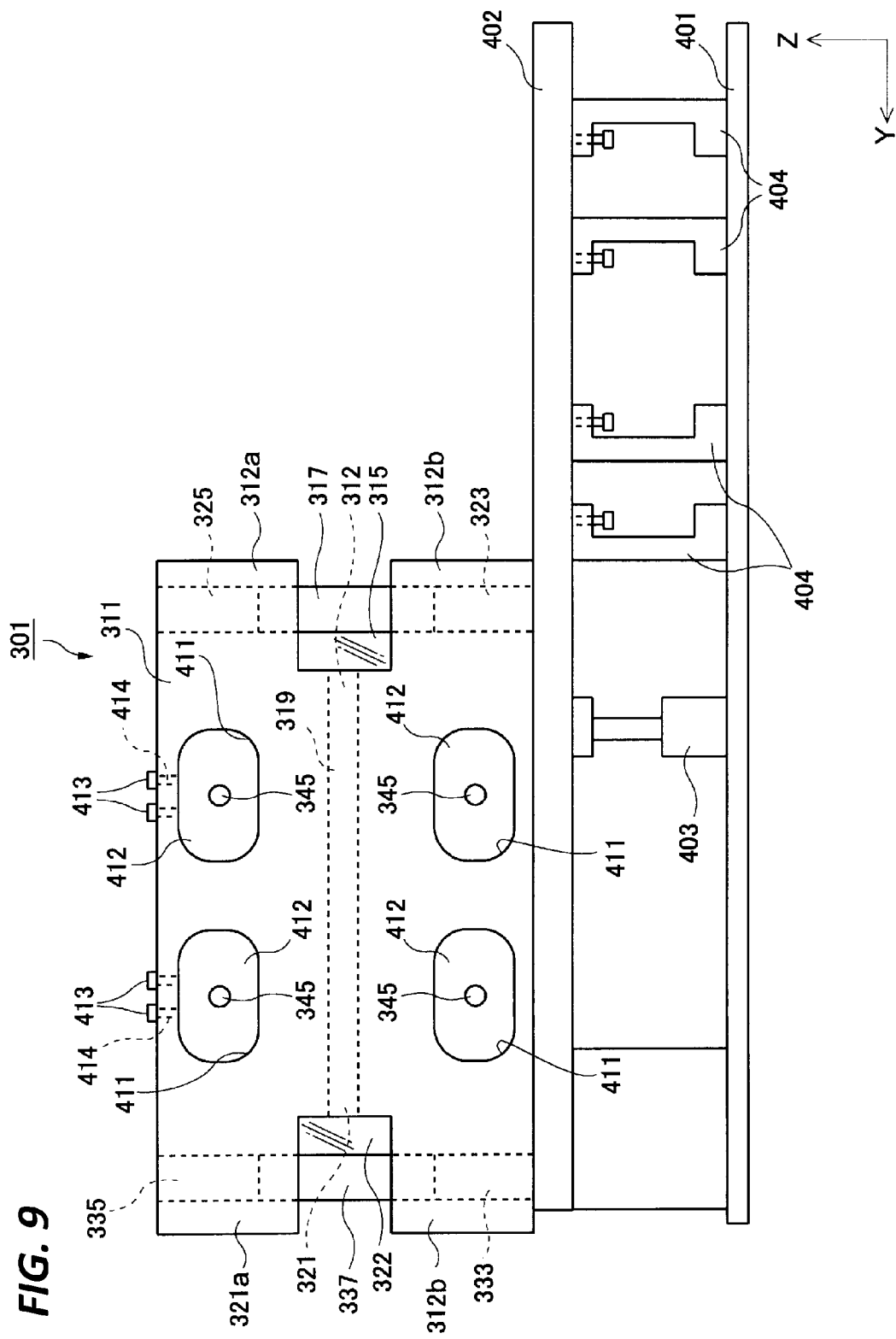

SUBSTRATE PROCESSING APPARATUS

CROSS-REFERENCE TO RELATED APPLICATIONS

This application is based on and claims priority from Japanese Patent Application No. 2016-223277 filed on Nov. 16, 2016 with the Japan Patent Office, the disclosure of which is incorporated herein in its entirety by reference.

TECHNICAL FIELD

The present disclosure relates to a substrate processing apparatus.

BACKGROUND

In a manufacturing process of a semiconductor device in which a laminated structure of an integrated circuit is formed on the surface of, for example, a semiconductor wafer (hereinafter referred to as a "wafer") as a substrate, a liquid processing step is performed to process the surface of the wafer using a liquid, for example, to remove fine dust or a natural oxide film on the surface of the wafer with a cleaning liquid such as, for example, a chemical liquid.

There is known a method of using a processing fluid in a supercritical state when removing, for example, a liquid remaining on a surface of a wafer in such a liquid processing step.

For example, Japanese Patent Laid-Open Publication No. 2013-012538 discloses a substrate processing apparatus in which a liquid remaining on a substrate is removed by bringing a fluid in a supercritical state into contact with the substrate. Further, Japanese Patent Laid-Open Publication No. 2013-016798 discloses a substrate processing apparatus in which a substrate is dried by dissolving an organic solvent on the substrate using a supercritical fluid.

SUMMARY

According to an aspect of the present disclosure, there is provided a substrate processing apparatus including: a container body configured to accommodate a substrate and perform a processing on the substrate using a high-pressure processing fluid; a conveyance port configured to carry the substrate into and out of the container body; an opening formed in the container body at a position different from the conveyance port; and a cover member configured to close the opening.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 9 is a side view illustrating a modification of the processing container of the supercritical processing apparatus.

DETAILED DESCRIPTION

Figure 1:
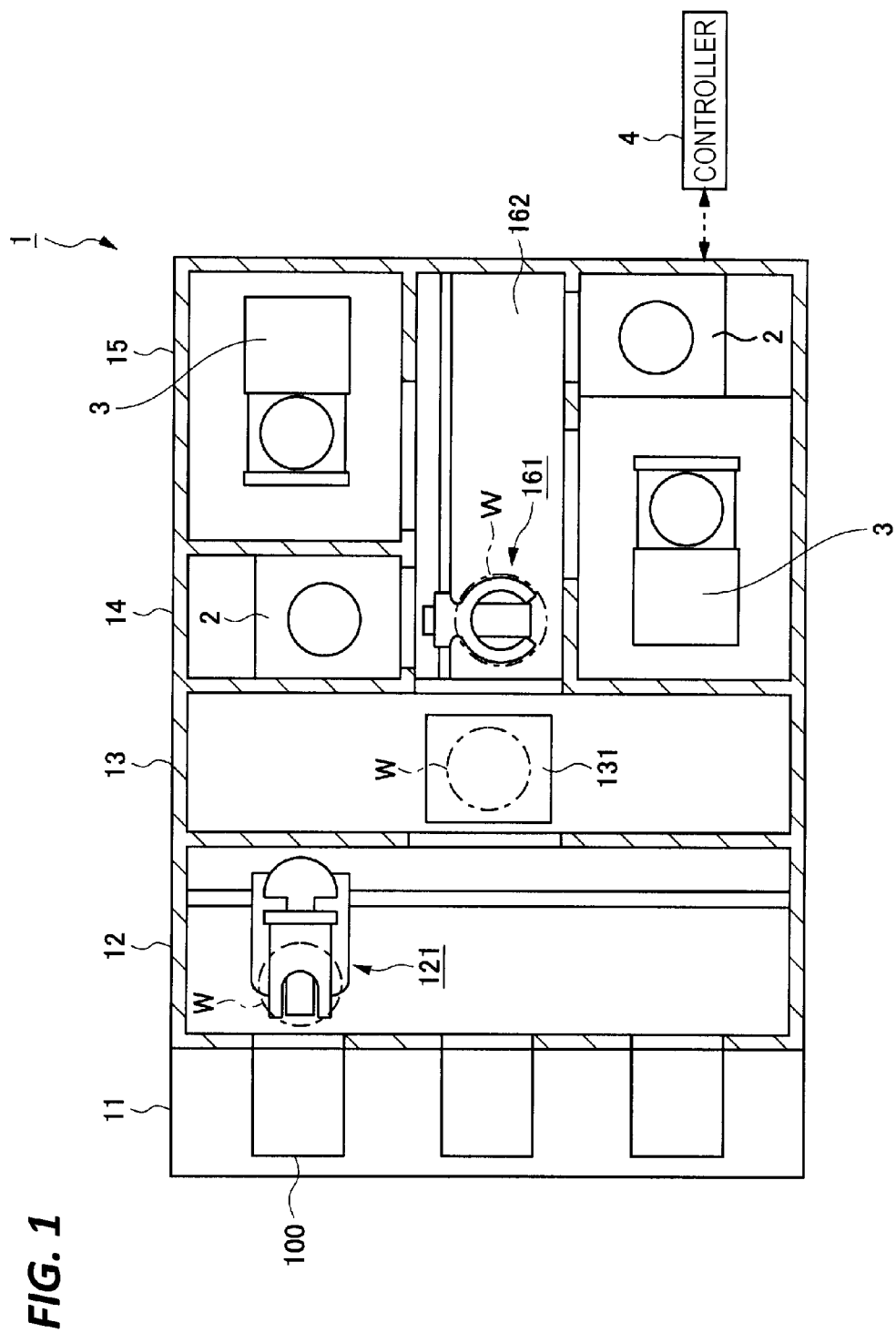
FIG. 1 is a cross-sectional plan view illustrating an overall configuration of a cleaning processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the related art, in a substrate processing apparatus using a supercritical fluid, since the pressure inside the processing container becomes high, the area of the conveyance port of the substrate has been made small in order to increase the pressure resistance of the processing container. Therefore, there is a problem in that the maintenance work in the processing container is not easy.

The present disclosure has been made under such circumstances, and the present disclosure is to provide a substrate processing apparatus capable of easily performing the maintenance work in the processing container.

According to an aspect of the present disclosure, there is provided a substrate processing apparatus including: a container body configured to accommodate a substrate and perform a processing on the substrate using a high-pressure processing fluid; a conveyance port configured to carry the substrate into and out of the container body; an opening formed in the container body at a position different from the conveyance port; and a cover member configured to close the opening.

The above-described substrate processing apparatus further includes a regulation member configured to regulate movement of the cover member due to a pressure in the container body.

In the above-described substrate processing apparatus, the container body is provided with a fitting hole, and the regulation member regulates the movement of the cover member by being fitted into the fitting hole.

In the above-described substrate processing apparatus, a first supply line is connected to the cover member to supply the processing fluid into the container body.

In the above-described substrate processing apparatus, the opening is provided at a position facing the conveyance port.

In the above-described substrate processing apparatus, a second supply line is connected to a bottom surface of the container body to supply the processing fluid into the container body.

According to the present disclosure, it is possible to easily perform the maintenance work in the processing container.

Hereinafter, an exemplary embodiment of the present disclosure will be described with reference to the drawings. The configuration illustrated in the drawings attached to the present specification may include portions in which sizes, scales, and the like are changed from the actual ones for convenience of illustration and ease of understanding.

[Configuration of Cleaning Processing System]

FIG. 1 is a cross-sectional plan view illustrating an overall configuration of a cleaning processing system 1.

The cleaning processing system 1 includes a plurality of cleaning apparatuses 2 (two cleaning apparatuses 2 in the example illustrated in FIG. 1) that supply a cleaning liquid to wafers W to perform a cleaning processing, and a plurality of supercritical processing apparatuses 3 (two supercritical processing apparatuses 3 in the example illustrated in FIG. 1) that remove a drying prevention liquid (isopropyl alcohol (IPA) in the present exemplary embodiment) remaining on the wafers W after the cleaning processing by bringing the drying prevention liquid into contact with a supercritical processing fluid (carbon dioxide ($CO_2$) in the present exemplary embodiment).

In the cleaning processing system 1, front opening unified pods (FOUPs) 100 are placed in a placing section 11, and the wafers W stored in the FOUPs 100 are delivered to a cleaning processing section 14 and a supercritical processing section 15 via a carry-in/out section 12 and a delivery section 13. In the cleaning processing section 14 and the supercritical processing section 15, the wafers W are first carried into the cleaning apparatuses 2 provided in the cleaning processing section 14 and are subjected to a cleaning processing. Then, the wafers W are carried into the supercritical processing apparatuses 3 and are subjected to a drying processing to remove the IPA from the wafers W. In FIG. 1, reference numeral "121" denotes a first conveyance mechanism that conveys the wafer W between the FOUPs 100 and the delivery section 13, and reference numeral "131" denotes a delivery shelf that plays a role as a buffer on which the wafers W conveyed between the carry-in/out section 12 and the cleaning processing section 14 and the supercritical processing section 15 are temporarily placed.

A wafer conveyance path 162 is connected to an opening of the delivery section 13, and the cleaning processing section 14 and the supercritical processing section 15 are provided along the wafer conveyance path 162. In the cleaning processing section 14, one cleaning apparatus 2 is disposed on each side of the wafer conveyance path 162. Thus, a total of two cleaning apparatuses 2 are installed. Meanwhile, in the supercritical processing section 15, one supercritical processing apparatus 3 functioning as a substrate processing apparatus for performing a drying processing for removing IPA from the wafers W is disposed on each side of the wafer conveyance path 162. Thus, a total of two supercritical processing apparatuses 3 are installed. A second conveyance mechanism 161 is disposed in the wafer conveyance path 162, and the second conveyance mechanism 161 is provided to be movable in the wafer conveyance path 162. The wafers W placed on the delivery shelf 131 are received by the second conveyance mechanism 161, and the second conveyance mechanism 161 carries the wafers W into the cleaning apparatuses 2 and the supercritical processing apparatuses 3. The number and arrangement of the cleaning apparatuses 2 and the supercritical processing apparatuses 3 are not particularly limited, but depending on, for example, the number of wafers W processed per unit time and the processing time of each cleaning apparatus 2 and each supercritical processing apparatus 3, an appropriate number of cleaning apparatuses 2 and supercritical processing apparatuses 3 are arranged in a suitable manner.

Each cleaning apparatus 2 is configured as a single wafer type apparatus that cleans the wafers W one by one by, for example, spin cleaning. In this case, the cleaning processing of a wafer W may be performed by supplying a chemical liquid for cleaning or a rinse liquid for washing away a chemical liquid to the processing surface of the wafer W at an appropriate timing while rotating the wafer W about the vertical axis in a state where the wafer W is horizontally held. The chemical liquid and the rinse liquid used in the cleaning apparatus 2 are not particularly limited. For example, an SC1 liquid (i.e., a mixed liquid of ammonia and hydrogen peroxide water), which is an alkaline chemical liquid, may be supplied to the wafer W to remove particles and organic contaminants from the wafer W. Thereafter, deionized water (DIW), which is a rinse liquid, may be supplied to the wafer W to wash out the SC1 liquid from the wafer W. Further, a diluted hydrofluoric acid (DHF) aqueous solution, which is an acidic chemical solution, may be supplied to the wafer W to remove a natural oxide film, and then, DIW may be supplied to the wafers W to wash out the dilute hydrofluoric acid aqueous solution from the wafer W.

Then, when the rinse processing with the DIW is completed, the cleaning apparatus 2 supplies the IPA as a drying prevention liquid to the wafer W while rotating the wafer W to replace the DIW remaining on the processing surface of the wafer W with the IPA. Then, the rotation of the wafer W is gently stopped. At this time, a sufficient amount of the IPA is supplied to the wafer W, so that the surface of the wafer W having a pattern of the semiconductor formed thereon is in a state of being filled with the IPA, and a liquid film of the IPA is formed on the surface of the wafer W. The wafer W is carried out from the cleaning apparatus 2 by the second conveyance mechanism 161 while maintaining the state of being filled with the IPA.

The IPA applied to the surface of the wafer W in this manner serves to prevent drying of the wafer W. In particular, in order to prevent the so-called pattern collapse from occurring on the wafer W due to evaporation of the IPA during the conveyance of the wafer W from the cleaning apparatus 2 to the supercritical processing apparatus 3, the cleaning apparatus 2 applies a sufficient amount of the IPA to the wafer W such that an IPA film having a relatively large thickness is formed on the surface of the wafer W.

The wafer W carried out from the cleaning apparatus 2 is carried into a processing container of the supercritical processing apparatus 3 by the second conveyance mechanism 161 in a state of being filled with the IPA, and is subjected to a drying processing of the IPA in the supercritical processing apparatus 3.

[Supercritical Processing Apparatus]

Hereinafter, details of the drying processing using a supercritical fluid performed in the supercritical processing apparatus (substrate processing apparatus) 3 will be described. First, descriptions will be made on an exemplary configuration of a processing container into which a wafer W is carried in the supercritical processing apparatus 3.

Figure 2:
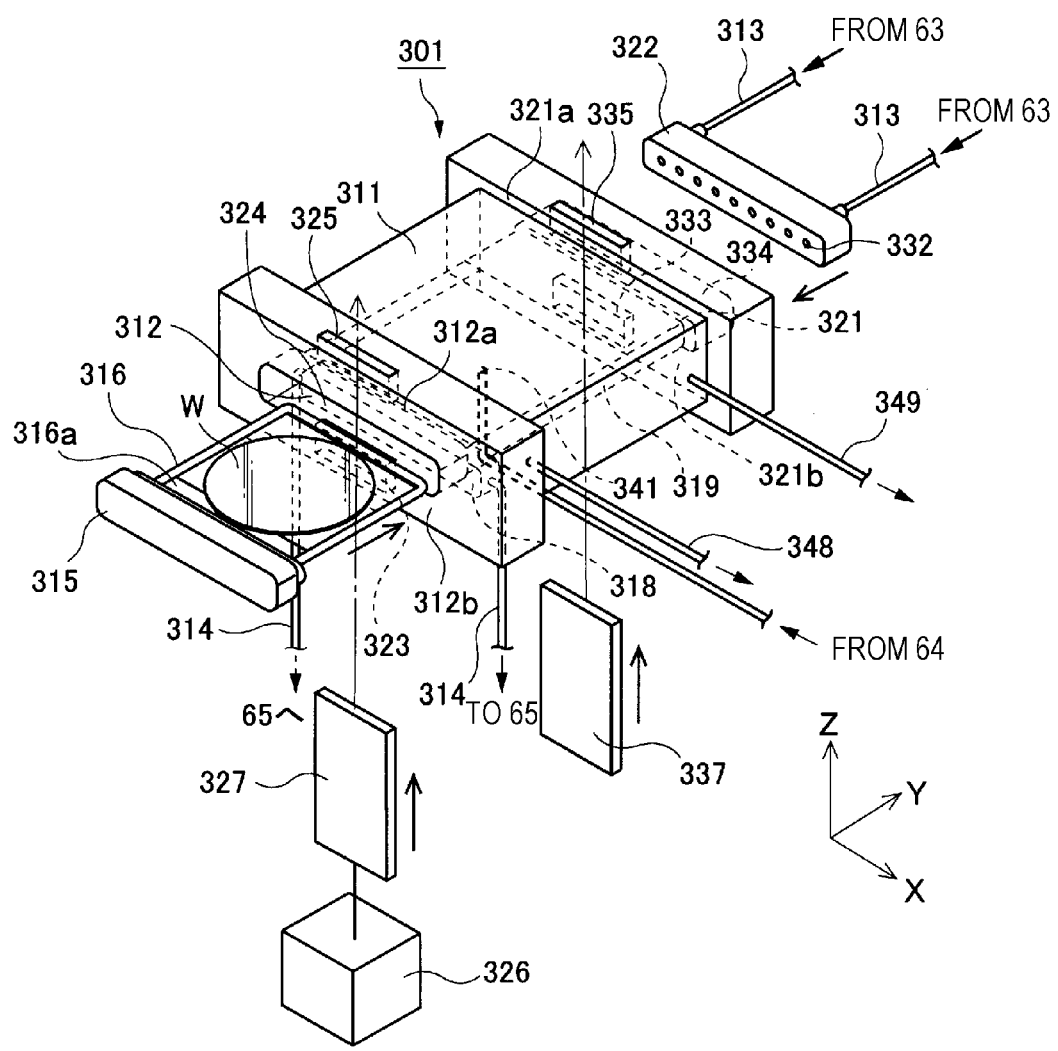
FIG. 2 is a perspective view illustrating the external appearance of an exemplary processing container of a supercritical processing apparatus.
Figure 3:
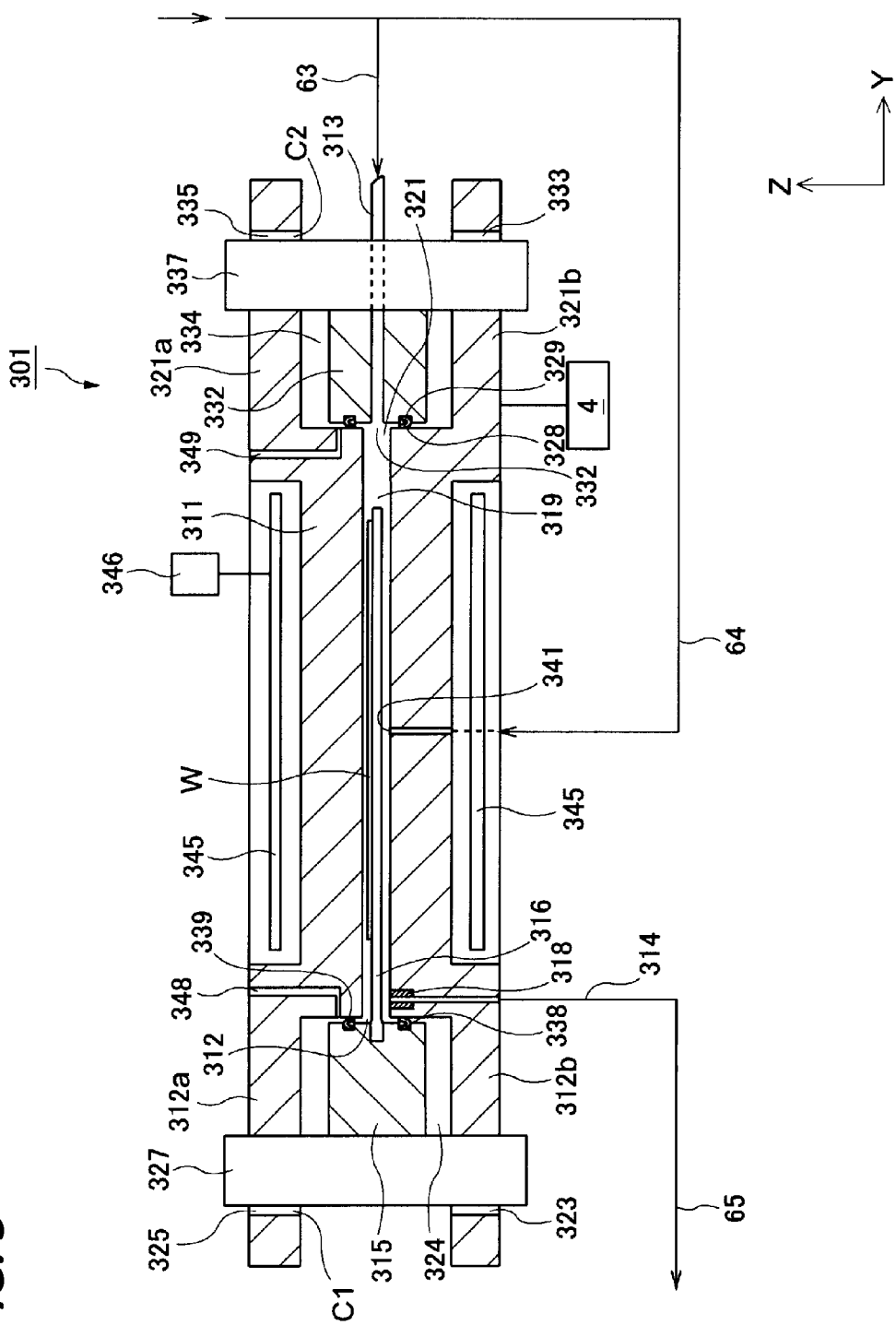
FIG. 3 is a cross-sectional view illustrating an exemplary processing container of a supercritical processing apparatus.

FIG. 2 is an external perspective view illustrating an example of a processing container 301 of a supercritical processing apparatus 3. FIG. 3 is a cross-sectional view illustrating an example of the processing container 301.

The processing container 301 is configured to accommodate the wafer W and perform a processing on the wafer W using a high-pressure processing fluid such as, for example, a supercritical fluid. The processing container 301 includes a case-type container body 311 in which the wafer W is accommodated, a conveyance port 312 for carrying the wafer W into and out of the container body 311, a holding plate 316 that holds the wafer W, which is a processing target, horizontally, and a first cover member 315 that supports the holding plate 316 and seals the conveyance port 312 when the wafer W is carried into the container body 311. Further, a maintenance opening (opening) 321 is provided at a position different from the conveyance port 312 of the container body 311. The maintenance opening 321 is closed by a second cover member 322 at times other than, for example, the time of the maintenance.

The container body 311 is configured to accommodate the wafer W and perform a processing on the wafer W using a processing fluid. The container body 311 is, for example, a container in which a processing space capable of accommodating the wafer W having a diameter of 300 mm is formed. The conveyance port 312 and the maintenance opening 321 (e.g., an opening having size and shape equivalent to those of the opening 312) are formed at both ends of the processing space 319, respectively, and both communicate with the processing space 319.

Further, a discharge port 314 is provided in a wall portion of the container body 311 on the conveyance port 312 side. The discharge port 314 is connected to a discharge side supply line 65 (see FIG. 6) provided on the downstream side of the processing container 301 to circulate the processing fluid. Although two discharge ports 314 are illustrated in FIG. 2, the number of the discharge ports 314 is not particularly limited.

A first upper block 312a and a first lower block 312b positioned at the upper side and the lower side of the conveyance port 312, respectively, are formed with fitting holes 325 and 323 for fitting a first lock plate 327 (to be described later). Each of the fitting holes 325 and 323 penetrates the first upper block 312a and the first lower block 312b in the vertical direction (a direction perpendicular to the surface of the wafer W).

The holding plate 316 is a thin plate-like member configured to be horizontally arranged in the processing space 319 of the container body 311 while holding the wafer W, and is connected to the first cover member 315. An outlet 316a is provided on the first cover member 315 side of the holding plate 316.

A first cover member accommodating space 324 is formed in a region on the front side (the minus side of the Y direction) of the container body 311. The first cover member 315 is accommodated in the first cover member accommodating space 324 when a supercritical processing is performed on the wafer W by carrying the holding plate 316 into the processing container 301. In this case, the first cover member 315 seals the processing space 319 by closing the conveyance port 312.

The first lock plate 327 is provided on the front side of the processing container 301. When the holding plate 316 is moved to a processing position, the first lock plate 327 serves as a regulation member that regulates the movement of the first cover member 315 due to the pressure in the container body 311. The first lock plate 327 is fitted into the fitting hole 323 of the first lower block 312b and the fitting hole 325 of the first upper block 312a. In this case, since the first lock plate 327 serves as a stopper, the movement of the first cover member 315 and the holding plate 316 in the forward and backward direction (Y direction in FIGS. 2 and 3) is regulated. Then, the first lock plate 327 is moved vertically by a lift mechanism 326 between a lock position where the first lock plate 327 is fitted into the fitting holes 323 and 325 to press the first cover member 315 and an open position where the first lock plate 327 is retracted downward from the lock position to open the first cover member 315. In this example, a regulation mechanism is configured by the first lock plate 327, the fitting holes 323, 325, and the lift mechanism 326 to regulate the movement of the first cover member 315 due to the pressure in the container body 311. Since a margin necessary for inserting and removing the first lock plate 327 is provided in each of the fitting holes 323 and 325, a small clearance C1 (FIG. 3) is formed between the fitting holes 323 and 325 and the first lock plate 327 at the lock position. For convenience of illustration, the clearance C1 is exaggerated in FIG. 3.

The maintenance opening 321 is provided at a position facing the conveyance port 312 along the wall surface of the container body 311. Since the maintenance opening 321 and the conveyance port 312 face each other in this manner, the pressure of the processing space 319 is applied substantially uniformly to the inner surface of the container body 311 when the container body 311 is sealed by the first cover member 315 and the second cover member 322. Thus, the stress is prevented from concentrating on a specific portion of the container body 311. However, the maintenance opening 321 may be provided at a position other than the position facing the conveyance port 312, for example, on the side wall surface of the container body 311 in the direction crossing the traveling direction (Y direction) of the wafer W.

A second upper block 321a and a second lower block 321b are positioned on the upper side and the lower side of the maintenance opening 321, respectively. The second upper block 321a and the second lower block 312b are formed with fitting holes 335 and 333 for fitting a second lock plate 337. Each of the fitting holes 335 and 333 penetrates the second upper block 321a and the second lower block 321b in the vertical direction (a direction perpendicular to the surface of the wafer W, i.e., the Z direction).

A second cover member accommodating space 334 is formed in a region on the back side (the plus side of the Y direction) of the container body 311. The second cover member 322 is accommodated in the second cover member accommodating space 334 and closes the maintenance opening 321 at times other than, for example, the time of the maintenance. Further, the second cover member 322 is provided with a supply port 313. The supply port 313 is connected to a first supply line 63 (see FIG. 6) provided on the upstream side of the processing container 301 to circulate the processing fluid. Although two supply ports 313 are illustrated in FIG. 2, the number of the supply ports 313 is not particularly limited.

The second lock plate 337 serves as a regulation member that regulates the movement of the second cover member 322 due to the pressure in the container body 311. The second lock plate 337 is fitted into the fitting holes 333 and 335 around the maintenance opening 321. In this case, since the second lock plate 337 serves as a stopper, the movement of the second cover member 322 in the forward and backward direction (Y direction) is regulated. Then, the second lock plate 337 is configured to be moved vertically between a lock position where the second lock plate 327 is fitted into the fitting holes 333 and 335 to press the second cover member 322 and an open position where the second lock plate 327 is retracted downward from the lock position to open the second cover member 322. In the exemplary embodiment, the second lock plate 337 is moved manually. However, the second lock plate 337 may be moved automatically by providing a lift mechanism similar to the lift mechanism 326. Since a margin necessary for inserting and removing the second lock plate 337 is provided in each of the fitting holes 333 and 335, a small clearance C2 (FIG. 3) is formed between the fitting holes 333 and 335 and the first lock plate 337 at the lock position. For convenience of illustration, the clearance C2 is exaggerated in FIG. 3.

In the present exemplary embodiment, the second cover member 222 is connected to the first supply line 63, and the second cover member 322 is formed with a plurality of apertures 332. The second cover member 322 plays a role as a fluid supply header that supplies the processing fluid from the first supply line 63 to the inside of the container body 311. Thus, when the second cover member 322 is removed at the time of the maintenance, the maintenance work (e.g., the cleaning of the apertures 332) may be easily performed. Further, a fluid discharge header 318 is provided in a wall portion of the container body 311 on the conveyance port 312 side to communicate with the discharge port 314. The fluid discharge header 318 is also formed with a plurality of apertures.

The second cover member 322 and the fluid discharge header 318 are provided to face each other. The second cover member 322 serving as a fluid supply unit supplies the processing fluid into the container body 311 in a substantially horizontal direction. The horizontal direction as used herein is a direction perpendicular to the vertical direction in which gravity acts, and is usually parallel to the direction in which the flat surface of the wafer W held by the holding plate 316 extends. The fluid discharge header 318 serving as a fluid discharge portion for discharging the fluid in the processing container 311 guides and discharges the fluid in the container body 311 to the outside of the container body 311 via the outlet 316a formed in the holding plate 316. The fluid discharged to the outside of the container body 311 through the fluid discharge header 318 includes, in addition to the processing fluid supplied into the container body 311 through the second cover member 322, the IPA dissolved in the processing fluid from the surface of the wafer W. Since the processing fluid is supplied into the container body 311 from the apertures 332 of the second cover member 322 and the fluid is discharged from the container body 311 through the apertures of the fluid discharge header 318 in this manner, a laminar flow of the processing fluid flowing substantially in parallel with the surface of the wafer W is formed in the container body 311.

Further, vacuum suction pipes 348 and 349 are connected to the side surface of the container body 311 on the conveyance port 312 side and the side surface of the container body 311 on the maintenance opening 321 side, respectively. The vacuum suction pipes 348 and 349 communicate with the surface of the container body 311 on the first cover member accommodating space 324 side and the surface of the container body 311 on the second cover member accommodating space 334 side, respectively. The vacuum suction pipes 348 and 349 serve to attract the first cover member 315 and the second cover member 322, respectively, to the container body 311 side by vacuum suction force.

A bottom surface side fluid supply unit 341 is formed on the bottom surface of the container body 311 to supply the processing fluid to the inside of the container body 311. The bottom surface side fluid supply unit 341 is connected to a second supply line 64 (see FIG. 6) that supplies a high-pressure fluid into the container body 311. The bottom surface side fluid supply unit 341 supplies the processing fluid into the container body 311 substantially from the lower side to the upper side. The processing fluid supplied from the bottom surface side fluid supply unit 341 flows around the surface of the wafer W from the back surface of the wafer W through the outlet 316a provided in the holding plate 316 and is discharged, along with the processing fluid from the second cover member 322, from the fluid discharge header 318 through the outlet 316a provided in the holding plate 316. The bottom surface side fluid supply unit 341 may be positioned, for example, below the wafer W introduced into the container body 311, particularly, below the center of the wafer W. In this manner, the processing fluid from the bottom surface side fluid supply unit 341 may uniformly flow around the surface of the wafer W.

As illustrated in FIG. 3, heaters 345 made of a resistance heating body (e.g., tape heaters) is provided on the upper and lower surfaces of the container body 311. The heaters 345 are connected to a power source unit 346 and may increase or decrease the output of the power source unit 346 to maintain the temperature of the container body 311 and the processing space 319 within a range of, for example, 100° C. to 300° C.

[Configuration of Periphery of Maintenance Opening]

Next, the configuration of the periphery of the maintenance opening 321 will be further described with reference to FIGS. 4 and 5.

Figure 4:
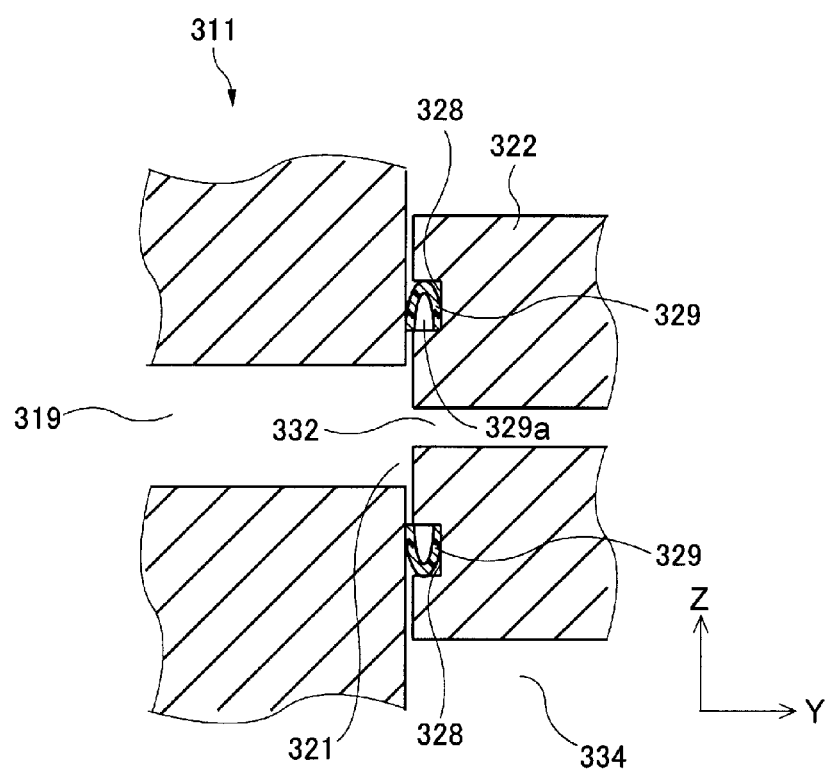
FIG. 4 is a cross-sectional view illustrating the periphery of an opening for maintenance of the processing container.
Figure 5:
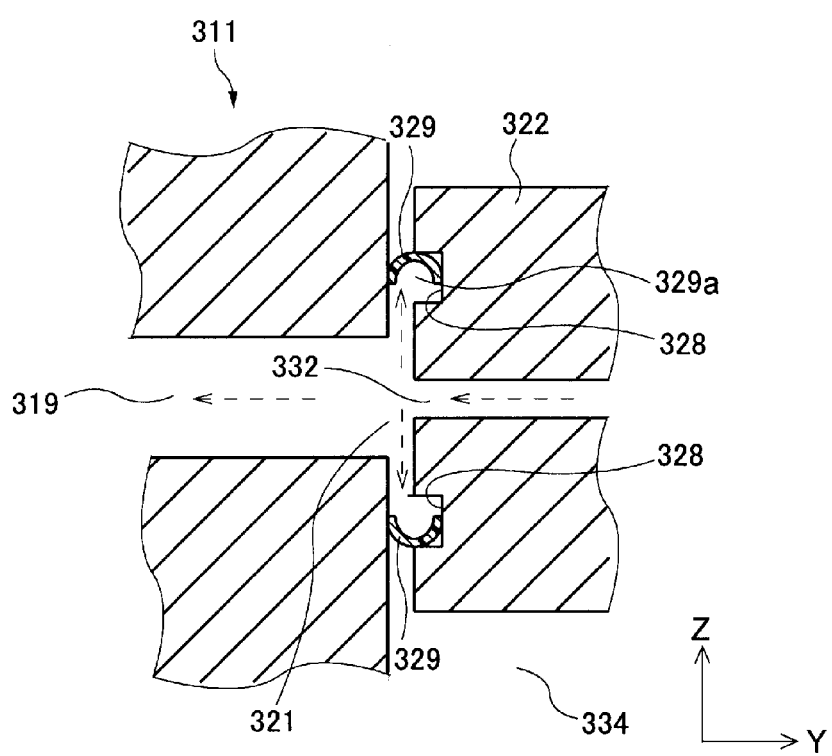
FIG. 5 is a cross-sectional view illustrating the periphery of the opening for maintenance of the processing container.

As illustrated in FIGS. 4 and 5, a recess 328 is formed on the side wall of the second cover member 322 on the processing space 319 side to surround the position corresponding to the peripheral edge of the maintenance opening 321. By fitting a seal member 329 into the recess 328, the seal member 329 is disposed on the side wall surface on the second cover member 322 side which is in contact with the side wall surface of the periphery of the maintenance opening 321.

The seal member 329 is formed in an annular shape so as to surround the maintenance opening 321. Further, the cross-sectional shape of the seal member 329 is U-shaped. In the seal member 329 illustrated in FIGS. 4 and 5, a U-shaped notch 329a is formed along the inner peripheral surface of the annular seal member 329. In other words, an inner space (notch 329a) surrounded in a U-shape is formed in the seal member 329.

By closing the periphery of the maintenance opening 321 using the second cover member 322 provided with the seal member 329, the seal member 329 is disposed between the facing surfaces of the second cover member 322 and the container body 311 so as to close the clearance between the second cover member 322 and the processing space 319. Since the clearance is formed around the maintenance opening 321 in the container body 311, the notch 329a formed along the inner circumferential surface of the seal member 329 is in communication with the processing space 319.

The seal member 329 in which the notch 329a is in communication with the processing space 319 is exposed to the atmosphere of the processing fluid. Thus, the processing fluid may elute components such as, for example, a resin and a rubber, and impurities contained therein. Therefore, the seal member 329 includes at least the notch 329a which is open toward the processing space 319 and the inside of which is made of a resin having a corrosion resistance against the liquid IPA and the processing fluid. Examples of the resin include polyimide, polyethylene, polypropylene, para-xylene, and polyether ether ketone (PEEK). A non-fluorine-based resin may be used, which has little influence on the semiconductor device even when a small amount of component is eluted into the processing fluid.

Hereinafter, descriptions will be made on the operation of the processing container 301 provided with the seal member 329 when a processing is performed on the wafer W in the processing container 301 using a high-pressure processing fluid.

First, when the high-pressure processing fluid is not supplied to the processing space 319 and the pressure in the container body 311 is not increased, the second cover member 322 is attracted toward the container body 311 side by the suction force from the vacuum suction pipe 349 (FIGS. 2 and 3). In this case, as illustrated in FIG. 4, the side wall surfaces of the second cover member 322 and the container body 311 directly face each other to press the seal member 329 so that the periphery of the maintenance opening 321 is hermetically sealed. The seal member 329 pressed by the second cover member 322 and the container body 311 is deformed in a direction in which the notch 329a is narrowed. At this time, when the notch 329a is not completely closed, the atmosphere in the processing space 319 flows into the notch 329a through the clearance between the second cover member 322 and the container body 311.

Meanwhile, when the high-pressure processing fluid is supplied from the apertures 332 into the processing space 319, the second cover member 322 moves in a direction away from the maintenance opening 321. That is, the second cover member 322 moves only by the clearance C2 (FIG. 3) between the fitting holes 335 and 333 around the maintenance opening 321 and the second lock plate 337, by the pressure received from the processing fluid. When the clearance between the second cover member 322 and the container body 311 becomes wide due to the movement of the second cover member 322, the notch 329a becomes wider due to the restoring force of the resilient sealing member 329. In addition, as illustrated in FIG. 5, the atmosphere (processing fluid) of the processing space 319 also enters the notch 329a (internal space).

When the processing fluid enters the notch 329a, a force is applied such that the seal member 329 is pressed and widened from the inside of the notch 329a, and the outer peripheral surface of the seal member 329 (the surface opposite to the notch 329a) is pushed toward the recess 328 side surface of the second cover member 322 and the side wall surface of the container body 311. Thus, the outer circumferential surface of the seal member 329 comes into tight contact with the second cover member 322 and the container body 311, and hermetically closes the clearance between the second cover member 322 and the container body 311. The seal member 329 of this type has elasticity that is capable of being deformed by the force received from the processing fluid and may maintain a state in which the clearance is hermetically sealed against the pressure difference between the processing space 319 and the outside (e.g., about 16 MPa to 20 MPa)).

In the exemplary embodiment, the conveyance port 312 of the container body 311 is also sealed by the first cover member 315 in the same manner as the maintenance opening 321.

That is, as illustrated in FIG. 3, a recess 338 is formed on the side wall of the first cover member 315 on the processing space 319 side to surround the position corresponding to the peripheral edge of the conveyance 312. By fitting a seal member 339 into the recess 338, the seal member 339 is disposed on the side wall surface on the first cover member 315 side which is in contact with the side wall surface of the periphery of the conveyance port 312.

The seal member 339 is formed in an annular shape so as to surround the conveyance port 312. Further, the cross-sectional shape of the seal member 339 is U-shaped. By closing the conveyance port 312 using the first cover member 315 provided with the seal member 339, the seal member 339 is disposed between the facing surfaces of the first cover member 315 and the container body 311 so as to close the clearance between the first cover member 315 and the conveyance port 312. In addition, the configuration for closing the conveyance port 312 using the first cover member 315 and the seal member 339 is substantially the same as the above-mentioned configuration for closing the maintenance opening 321.

[Configuration of Overall System of Supercritical Processing Apparatus]

Figure 6:
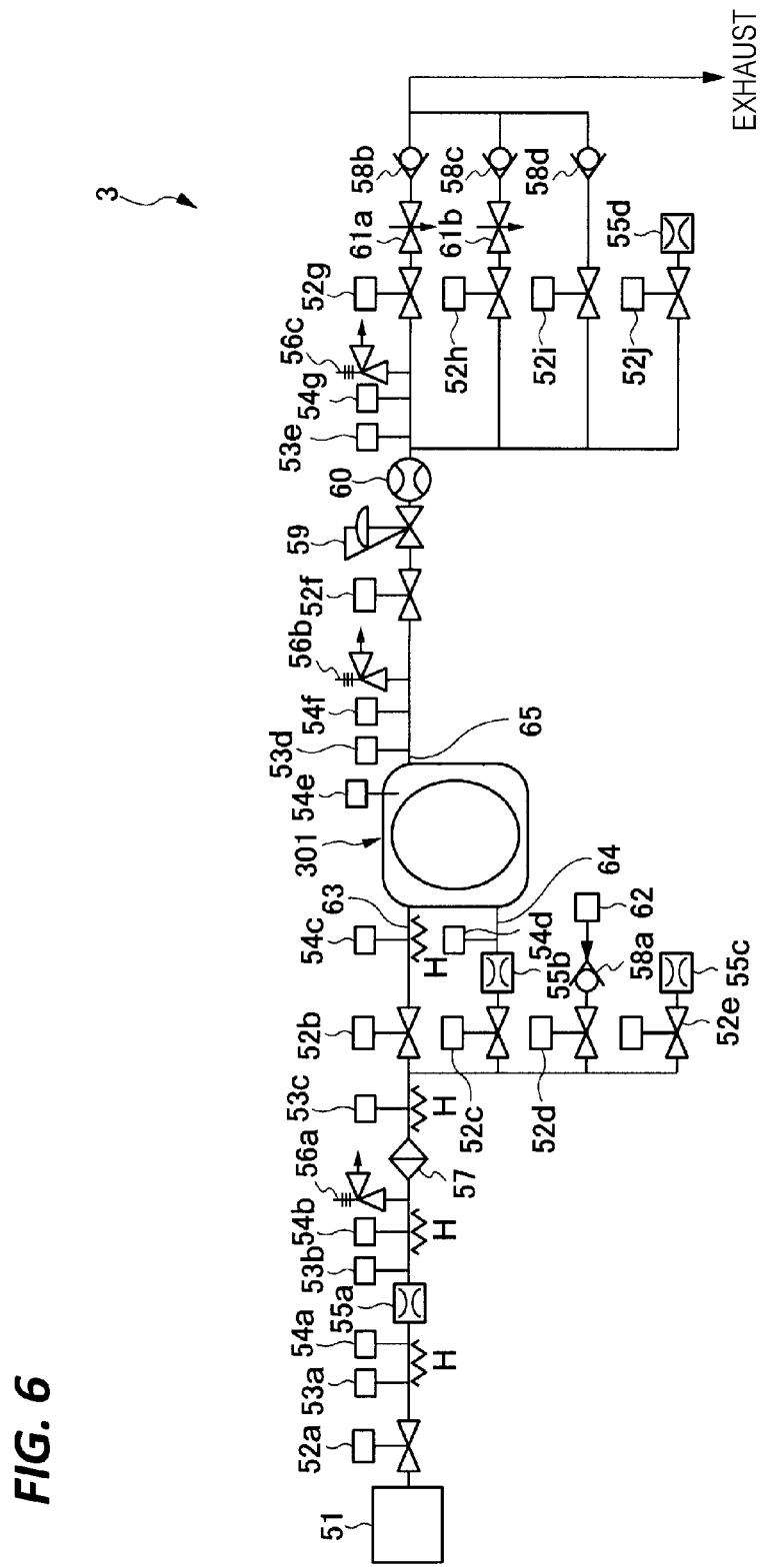
FIG. 6 is a view illustrating an exemplary configuration of the overall system of the supercritical processing apparatus.

FIG. 6 is a view illustrating an exemplary configuration of the overall system of the supercritical processing apparatus 3.

A fluid supply tank 51 is provided on the upstream side of the processing container 301, and a processing fluid is supplied from the fluid supply tank 51 to a supply line for circulating the processing fluid in the supercritical processing apparatus 3. Between the fluid supply tank 51 and the processing container 301, a flow on/off valve 52a, an orifice 55a, a filter 57, and a flow on/off valve 52b are sequentially provided from the upstream side to the downstream side. The terms "upstream side" and "downstream side" as used herein refer to the flow direction of the processing fluid in the supply line as a reference.

The flow on/off valve 52a is a valve for adjusting on/off of the supply of the processing fluid from the fluid supply tank 51. In the open state, the processing fluid is allowed to flow to the supply line on the downstream side, and in the closed state, the processing fluid is not allowed to the supply line on the downstream side. When the flow on/off valve 52a is in the open state, a high-pressure processing fluid of, for example, about 16 MPa to 20 MPa (megapascals) is supplied from the fluid supply tank 51 to the supply line via the flow on/off valve 52a. The orifice 55a plays a role of adjusting the pressure of the processing fluid supplied from the fluid supply tank 51, so that the processing fluid the pressure of which is adjusted to, for example, about 16 MPa may flow through the supply line on the downstream side of the orifice 55a. The filter 57 removes foreign matters contained in the processing fluid sent from the orifice 55a and flows a clean processing fluid to the downstream side.

The flow on/off valve 52b is a valve for adjusting on/off of the supply of the processing fluid to the processing container 301. The first supply line 63 extending from the flow on/off valve 52b to the processing container 301 is connected to the supply port 313 illustrated in FIGS. 2 and 3, and the processing fluid from the flow on/off valve 52b is supplied into the container body 311 of the processing container 301 via the supply port 313 and the second cover member 322 illustrated in FIGS. 2 and 3.

In the supercritical processing apparatus 3 illustrated in FIG. 6, the supply line diverges between the filter 57 and the flow on/off valve 52b. That is, the supply line between the filter 57 and the flow on/off valve 52b diverges into a supply line connected to the processing container 301 via a flow on/off valve 52c and an orifice 55b (the second supply line 64), a supply line connected to a purge device 62 via a flow on/off valve 52d and a check valve 58a, and a supply line connected to the outside via a flow on/off valve 52e and an orifice 55c.

The second supply line 64 connected to the processing container 301 via the flow on/off valve 52c and the orifice 55b is connected to the bottom surface side fluid supply unit 341 illustrated in FIGS. 2 and 3, and the processing fluid from the flow on/off valve 52c is supplied into the container body 311 of the processing container 301 via the bottom surface side fluid supply unit 341 illustrated in FIGS. 2 and 3. The second supply line 64 may be used as an auxiliary flow path for the supply of the processing fluid to the processing container 301. For example, when a relatively large amount of processing fluid is supplied to the processing container 301, for example, at the beginning of the supply of the processing fluid to the processing container 301, the flow on/off valve 52c is adjusted to the open state, so that the processing fluid the pressure of which is adjusted by the orifice 55b may be supplied to the processing container 301.

The supply line connected to the purge device 62 via the flow on/off valve 52d and the check valve 58a is a flow path for supplying an inert gas (e.g., nitrogen) to the processing container 301, and is utilized while the supply of the processing fluid from the fluid supply tank 51 to the processing container 301 is stopped. For example, in a case where the processing container 301 is filled with an inert gas and maintained in a clean state, the flow on/off valve 52d and the flow on/off valve 52b are adjusted to the open state, so that the inert gas sent from the purge device 62 to the supply line is supplied to the processing container 301 via the check valve 58a, the flow on/off valve 52d, and the flow on/off valve 52b.

The supply line connected to the outside via the flow on/off valve 52e and the orifice 55c is a flow path for discharging the processing fluid from the supply line. For example, when the processing fluid remaining in the supply line between the flow on/off valve 52a and the flow on/off valve 52b is discharged to the outside at the time of turning off the power supply of the supercritical processing apparatus 3, the flow on/off valve 52e is adjusted to the open state, so that the supply line between the flow on/off valve 52a and the flow on/off valve 52b communicates with the outside.

On the downstream side of the processing container 301, a flow on/off valve 52f, an exhaust adjustment valve 59, a concentration measurement sensor 60, and a flow on/off valve 52g are sequentially provided from the upstream side to the downstream side.

The flow on/off valve 52f is a valve for adjusting on/off of the discharge of the processing fluid from the processing container 301. When the processing fluid is discharged from the processing container 301, the flow on/off valve 52f is adjusted to the open state, whereas when the processing fluid is not discharged from the processing container 301, the flow on/off valve 52f is adjusted to the closed state. A supply line extending between the processing container 301 and the flow on/off valve 52f (a discharge side supply line 65) is connected to the discharge port 314 illustrated in FIGS. 2 and 3. The fluid in the container body 311 of the processing container 301 is sent toward the flow on/off valve 52f via the fluid discharge header 318 and the discharge ports 314 illustrated in FIGS. 2 and 3.

The exhaust adjustment valve 59 is a valve for adjusting the discharge amount of the fluid from the processing container 301, and may be constituted by, for example, a back pressure valve. The opening degree of the exhaust adjustment valve 59 is adaptively adjusted under the control of a controller 4 depending on a desired discharge amount of the fluid from the processing container 301. In the present exemplary embodiment, a processing of discharging the fluid from the processing container 301 is performed, for example, until the pressure of the fluid in the processing container 301 reaches a predetermined pressure. Therefore, when the pressure of the fluid in the processing container 301 reaches a predetermined pressure, the exhaust adjustment valve 59 may stop the discharge of the fluid from the processing container by adjusting the opening degree so as to shift from the open state to the closed state.

The concentration measurement sensor 60 is a sensor for measuring the concentration of the IPA contained in the fluid sent from the exhaust adjustment valve 59.

The flow on/off valve 52g is a valve for adjusting on/off of the discharge of the fluid from the processing container 301 to the outside. When the fluid is discharged to the outside, the flow on/off valve 52g is adjusted to the open state, whereas when the fluid is not discharged, the flow on/off valve 52g is adjusted to the closed state. An exhaust adjustment needle valve 61a and a check valve 58b are provided on the downstream side of the flow on/off valve 52g. The exhaust adjustment needle valve 61a is a valve for adjusting the discharge amount of the fluid sent to the outside via the flow on/off valve 52g, and the opening degree of the exhaust adjustment needle valve 61a is adjusted depending on a desired discharge amount of the fluid. The check valve 58b is a valve for preventing backflow of the discharged fluid and plays a role of reliably discharging the fluid to the outside.

In the supercritical processing apparatus 3 illustrated in FIG. 6, the supply line diverges between the concentration measurement sensor 60 and the flow on/off valve 52g. That is, the supply line between the filter 60 and the flow on/off valve 52b diverges into a supply line connected to the outside via a flow on/off valve 52h, a supply line connected to the outside via a flow on/off valve 52i, and a supply line connected to the outside via a flow on/off valve 52j.

Similarly to the flow on/off valve 52g, the flow on/off valve 52h and the flow on/off valve 52i are valves for controlling on/off of the discharge of the fluid to the outside. An exhaust adjustment needle valve 61b and a check valve 58c are provided on the downstream side of the flow on/off valve 52h to adjust the discharge amount of the fluid and to prevent backflow of the fluid. A check valve 58d is provided on the downstream side of the flow on/off valve 52i to prevent backflow of the fluid. The flow on/off valve 52j is also a valve for adjusting on/off of the discharge of the fluid to the outside, and an orifice 55d is provided on the downstream side of the flow on/off valve 52j, so that the fluid may be discharged from the flow on/off valve 52j to the outside via the orifice 55d. In the example illustrated in FIG. 6, however, the destination of the fluid sent to the outside via the flow on/off valve 52g, the flow on/off valve 52h, and the flow on/off valve 52i is different from the destination of the fluid sent to the outside via the flow on/off valve 52j. Therefore, it is also possible to send the fluid to a recovery device (not illustrated) via, for example, the flow on/off valve 52g, the flow on/off valve 52h, and the flow on/off valve 52i, while discharging the fluid to the atmosphere via the flow on/off valve 52j.

When the fluid is discharged from the processing container 301, one or more of the flow on/off valve 52g, the flow on/off valve 52h, the flow on/off valve 52i, and the flow on/off valve 52j is adjusted to the open state. In particular, when the power of the supercritical processing apparatus 3 is turned off, the flow on/off valve 52j may be adjusted to the open state so as to discharge the fluid remaining in the supply line between the concentration measurement sensor 60 and the flow on/off valve 52g to the outside.

Pressure sensors and temperature sensors are provided at various positions of the above-mentioned supply line to detect the pressure and the temperature of the fluid. In the example illustrated in FIG. 6, a pressure sensor 53a and a temperature sensor 54a are provided between the flow on/off valve 52a and the orifice 55a, a pressure sensor 53b and a temperature sensor 54b are provided between the orifice 55a and the filter 57, a pressure sensor 53c is provided between the filter 57 and the flow on/off valve 52b, a temperature sensor Mc is provided between the flow on/off valve 52b and the processing container 301, and a temperature sensor 54d is provided between the orifice 55b and the processing container 301. Further, a pressure sensor 53d and a temperature sensor 54f are provided between the processing container 301 and the flow on/off valve 52f, and a pressure sensor 53e and a temperature sensor Mg are provided between the concentration measurement sensor 60 and the flow on/off valve 52g. Furthermore, a temperature sensor 54e is provided to detect the temperature of the fluid in the container body 311, which is the inside of the processing container 301.

Further, heaters H are provided at arbitrary positions where the processing fluid flows in the supercritical processing apparatus 3. In FIG. 6, the heaters H are provided in the supply line on the upstream side of the processing container 301 (i.e., between the flow on/off valve 52a and the orifice 55a, between the orifice 55a and the filter 57, between the filter 57 and the flow on/off valve 52b, and between the flow on/off valve 52b and the processing container 301). However, the heaters H may be provided at other portions including the processing container 301 and the supply line on the downstream side of the processing container 301. Therefore, the heaters H may be provided in the entire flow path in which the processing fluid supplied from the fluid supply tank 51 is discharged to the outside. Further, in particular, from the viewpoint of adjusting the temperature of the processing fluid to be supplied to the processing container 301, the heaters H may be provided at positions where the temperature of the processing fluid flowing on the upstream side of the processing container 301 may be adjusted.

Furthermore, a safety valve 56a is provided between the orifice 55a and the filter 57, and a safety valve 56b is provided between the processing container 301 and the flow on/off valve 52f, and a safety valve 56c is provided between the concentration measurement sensor 60 and the flow on/off valve 52g. These safety valves 56a to 56c play a role of making the supply line communicate with the outside so that the fluid in the supply line is urgently discharged to the outside in a case of an abnormality such as when the pressure in the supply line becomes excessive.

[Supercritical Drying Processing]

Next, the drying mechanism of IPA using the processing fluid in the supercritical state will be described.

FIGS. 7A to 7D are enlarged cross-sectional views for explaining a drying mechanism of IPA, in which patterns P are schematically illustrated as recesses of the wafer W.

Figure 7A:
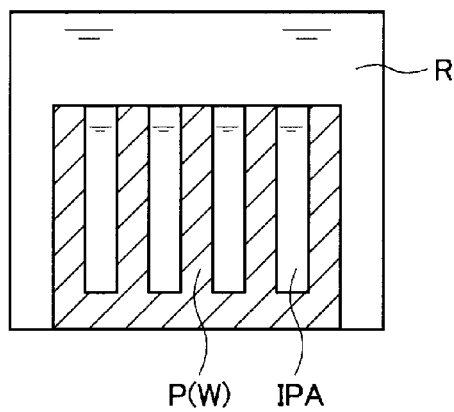
FIGS. 7A to 7D are enlarged cross-sectional views for explaining a drying mechanism of IPA, in which patterns are schematically illustrated as recesses of a wafer.

At the beginning of the introduction of a processing fluid R in a supercritical state into the container body 311 of the processing container 301 in the supercritical processing apparatus 3, only IPA is filled between the patterns P as illustrated in FIG. 7A.

Figure 7B:
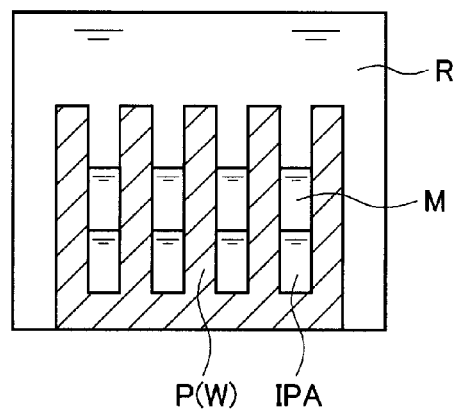

The IPA between the patterns P are gradually dissolved in the processing fluid R by coming into contact with the processing fluid R in the supercritical state, and gradually replaced with the processing fluid R, as illustrated in FIG. 7B. At this time, there is a mixed fluid M in a state in which the IPA and the processing fluid R are mixed, in addition to the IPA and the processing fluid R, between the patterns P.

Figure 7C:
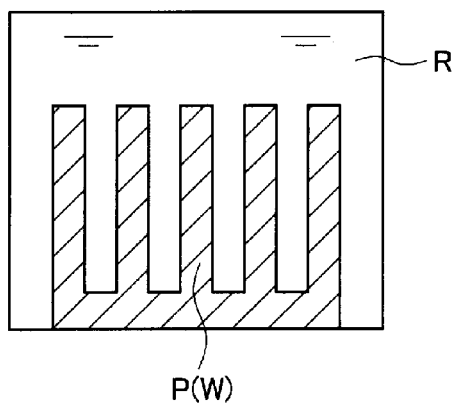

As the replacement of the IPA with the processing fluid R progresses between the patterns P, the IPA is removed between the patterns P, and finally only the processing fluid R in the supercritical state is filled between the patterns P as illustrated in FIG. 7C.

Figure 7D:
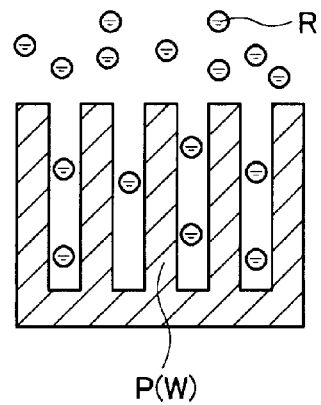

After the IPA is removed between the patterns P, the pressure inside the container body 311 is lowered to atmospheric pressure, so that the processing fluid R changes from the supercritical state to the gas state as illustrated in FIG. 7D, and the gaps between the patterns P is occupied only by the gas. Thus, the IPA between the patterns P is removed, and the drying processing of the wafer W is completed.

On the background of the mechanisms illustrated in FIGS. 7A to 7D, the supercritical processing apparatus 3 of the present exemplary embodiment performs a drying processing of IPA as follows.

That is, the substrate processing method performed by the supercritical processing apparatus 3 includes a step of carrying a wafer W in which IPA for drying prevention is filled between the patterns P into the container body 311 of the processing container 301, a step of supplying a processing fluid in a supercritical state into the container body 311 via the fluid supply unit (i.e., the supply tank 51, the flow on/off valve 52a, the flow on/off valve 52b, and the second cover member 322), and a step of performing a drying processing for removing the IPA in the container body 311 using the processing fluid in the supercritical state.

That is, the wafer W in which the cleaning process has been performed in the cleaning apparatus 2 is conveyed to the supercritical processing apparatus 3. In the cleaning apparatus 2, for example, removal of particles and organic contaminants by an SC1 solution, which is an alkaline solution, rinse with deionized water (DIW), which is a rinse liquid, removal of the natural oxide film by a diluted hydrofluoric acid (DHF), and rinse with DIW are performed in this order. Finally, IPA is filled on the surface of the wafer. Then, the wafer W is carried out from the cleaning apparatus 2 in this state and conveyed to the processing container 301 of the supercritical processing apparatus 3.

The conveyance to the processing container 301 is performed using, for example, the second conveyance mechanism 161 (see FIG. 1). When the wafer is conveyed to the processing container 301, the second conveyance mechanism 161 delivers the wafers W to the holding plate 316, which waits at the delivery position, and then, retracts from the upper position of the holding plate 316.

Next, the holding plate 316 slides horizontally to move the holding plate 316 to the processing position in the container body 311. At this time, the first cover member 315 is accommodated in the first cover member accommodating space 324 and covers the conveyance port 312. Subsequently, the first cover member 315 is attracted to the container body 311 by the suction force from the vacuum suction pipe 348 (FIGS. 2 and 3), so that the conveyance port 312 is blocked by the first cover member 315. Next, the first lock plate 327 is moved up to the lock position by the lift mechanism 326, and the first lock plate 327 and the front surface of the first cover member 315 are brought into contact with each other, thereby regulating the movement of the first cover member 315.

Subsequently, before the IPA on the surface of the wafer W is dried, the flow on/off valves 52b and 52c are opened to supply a high-pressure processing fluid to the processing space 319 via the first supply line 63 and the second supply line 64. Thus, the pressure in the processing space 319 is increased to, for example, about 14 MPa to 16 MPa. As the processing space 319 is pressurized, the seal member 339 having a U-shaped cross section, which is provided in the recess 338 of the first cover member 315, is pressed and widened to hermetically seal the clearance between the first cover member 315 and the container body 311.

Meanwhile, in the processing space 319, when the processing fluid supplied into the processing space 319 comes into contact with the IPA filled on the wafer W, the filled IPA is gradually dissolved in the processing fluid and is gradually replaced with the processing fluid. Then, as the replacement of the IPA with the processing fluid progresses between the patterns P of the wafer W, the IPA is removed between the patterns P, and finally only the processing fluid in the supercritical state is filled between the patterns P. As a result, the surface of the wafer W is replaced with the processing fluid from the liquid IPA. However, since the interface between the liquid IPA and the processing fluid is not formed in the equilibrium state, the fluid on the surface of the wafer W may be replaced with the processing fluid without causing the pattern collapse.

Thereafter, when the surface of the wafer W has been replaced with the processing fluid after a predetermined time has elapsed since the supply of the processing fluid into the processing space 319, the flow on/off valve 52f is opened to discharge the atmosphere in the processing space 319 from the fluid discharge header 318 toward the outside of the container body 311. Thus, the pressure in the container body 311 is gradually decreased, and the processing fluid in the processing space 319 changes from the supercritical state to the gas state. Since no interface is formed between the supercritical state and the gas at this time, the wafer W may be dried without causing the surface tension to act on the patterns formed on the surface of the wafer W.

After the supercritical processing of the wafer W is completed by the above-described process, $N_2$ gas is supplied from a purge gas supply line (not illustrated) and purged to the fluid discharge header 318 to discharge the remaining gaseous processing fluid in the processing space 319. Then, when the purge is completed by supplying $N_2$ gas for a predetermined time and the pressure in the container body 311 returns to the atmospheric pressure, the first lock plate 327 is moved down to the open position. Then, the holding plate 316 is moved horizontally to the delivery position, and the wafer W which has been subjected to the supercritical processing is carried out using the second conveyance mechanism 161.

However, while the supercritical processing described above is performed, the second lock plate 337 is raised to the lock position at all times. Therefore, the second lock plate 337 and the rear surface of the second cover member 322 come into contact with each other, thereby restricting the movement of the second cover member 322. In a case where the high-pressure processing fluid is not supplied to the processing space 319 and the pressure in the container body 311 is not increased, the side wall surfaces of the second cover member 322 and the container body 311 directly face each other to press the seal member 329 so that the periphery of the maintenance opening 321 is hermetically sealed.

Meanwhile, when the high-pressure processing fluid is supplied to the processing space 319, the second cover member 322 is moved by the clearance C2 between the fitting holes 335 and 333 around the maintenance opening 321 and the second lock plate 337 in a direction away from the processing space 319 (the plus side of the Y direction). As the second cover member 322 is moved, the clearance between the second cover member 322 and the container body 311 is widened. In this case, since the notch 329a becomes wide due to the restoring force of the resilient sealing member 329, the outer circumferential surface of the seal member 329 comes into tight contact with the second cover member 322 and the container body 311, and hermetically closes the clearance between the second cover member 322 and the container body 311. Thus, while the above-described supercritical processing is performed, the second cover member 322 is kept in a state where the maintenance opening 321 is closed.

[Operation during Maintenance]

Next, descriptions will be made on an operation when maintenance is performed on the processing container 301 after the above-described supercritical processing is completed.

Figures 8A, 8B:
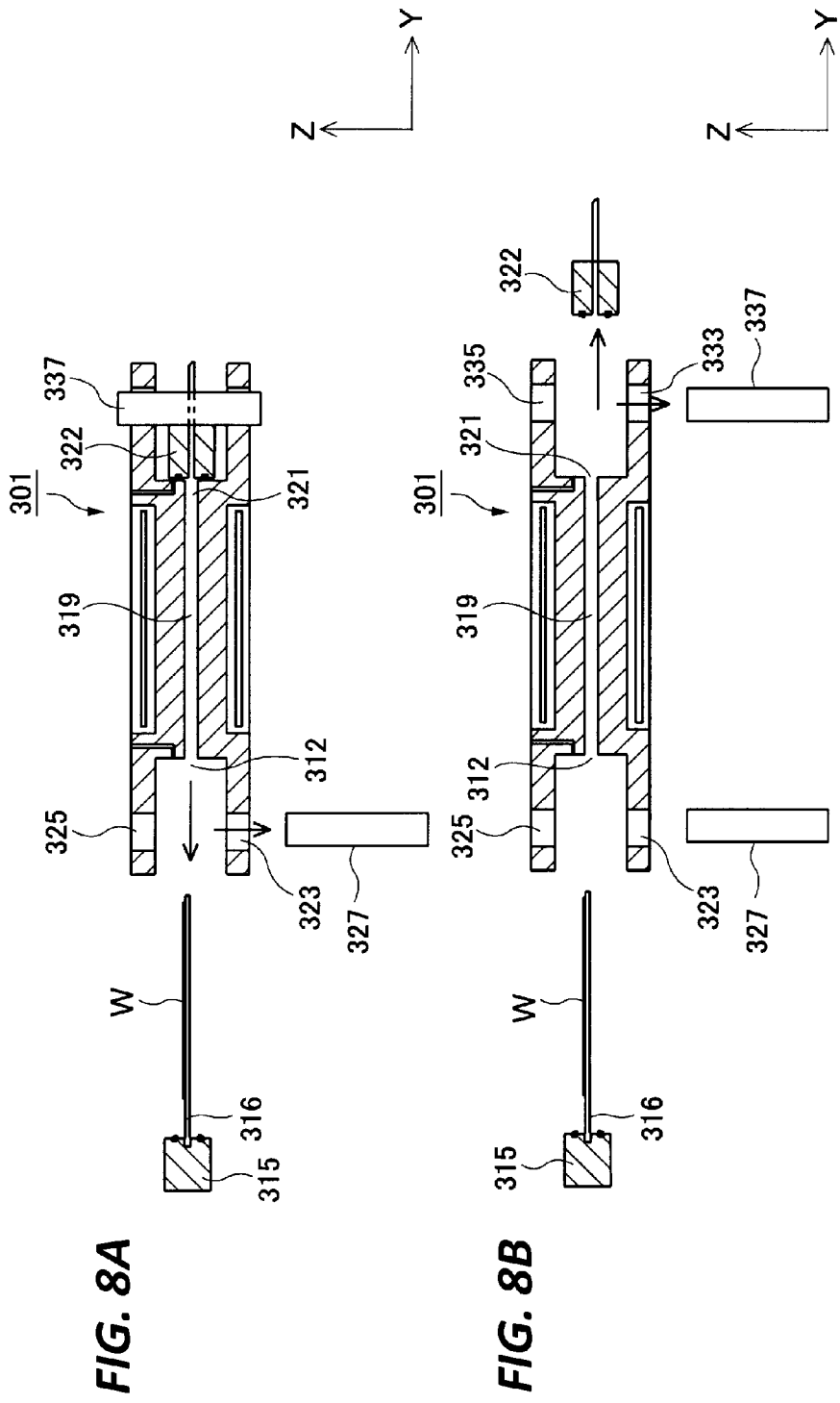
FIGS. 8A and 8B are cross-sectional views illustrating the operation of the processing container of the supercritical processing apparatus during the maintenance.

First, the inside of the processing space 319 is released to the atmospheric pressure. Next, the first lock plate 327 is moved downward from the fitting holes 323 and 325 by the lift mechanism 326 so that the first cover member 315 is set at the opening position. Next, the first cover member 315 and the holding plate 316 are moved to the front side (the minus side of the Y direction). Thus, the holding plate 316 is taken out of the processing space 319, and the first cover member 315 is separated from the conveyance port 312 (FIG. 8A).

Next, the second lock plate 337 is moved downward from the fitting holes 333 and 335 so that the second cover member 322 is set at the opening position. Next, the second cover member 322 is moved to the back side (the plus side of the Y direction) so that the second cover member 322 is separated from the maintenance opening 321 (FIG. 8B).

Subsequently, a cleaning jig or tool is inserted from the maintenance opening 321, and the maintenance work (e.g., cleaning or adjustment) in the processing space 319 is performed. In the present exemplary embodiment, it is possible to access the inside of the processing space 319 merely by moving the second lock plate 337 downward to remove the second cover member 322. Thus, such maintenance work may be easily performed. Further, since the supply port 313 is connected to the second cover member 322, the maintenance work (e.g., cleaning or adjustment) of the supply port 313 and the apertures 332 may also be easily performed, along with the maintenance work in the processing space 319.

After the maintenance work is completed in this manner, the second cover member 322 and the first cover member 315 are assembled with respect to the container body 311 in the reverse order to that described above. That is, the second cover member 322 is first moved to the front side (the minus side of the Y direction) to cover the maintenance opening 321 with the second cover member 322. Next, the second cover member 322 is sucked to the container body 311 side by the suction force from the vacuum suction pipe 349. Next, the second lock plate 337 is moved up such that the second lock plate 337 is fitted into the fitting holes 333 and 335. Thus, the second lock plate 337 is set at the lock position where the second cover member 322 is pressed. Therefore, the periphery of the maintenance opening 321 is hermetically closed.

Next, the first cover member 315 and the holding plate 316 are moved to the back side (the plus side of the Y direction) to cause the holding plate 316 to enter the processing space 319, and the first cover member 315 covers the conveyance port 312. Next, the first cover member 315 is sucked to the container body 311 side by the suction force from the vacuum suction pipe 348. Next, the first lock plate 327 is moved up by the lift mechanism 326 such that the first lock plate 327 is fitted into the fitting holes 323 and 325. Thus, the second lock plate 337 is set at the lock position. Therefore, the periphery of the conveyance port 312 is hermetically closed, and the processing space 319 is sealed again. Thereafter, the above-described supercritical processing is performed as necessary.

As described above, according to the exemplary embodiment, the maintenance opening 321 is provided at a position different from the conveyance port 312 of the container body 311, and the maintenance opening 321 is closed by the second cover member 322. Thus, the processing space 319 of the container body 311 may be easily accessed only by removing the second cover member 322. In this case, since the maintenance work is easily performed on container body 311, it is possible to improve the work efficiency of the maintenance work.

Further, according to the exemplary embodiment, the second lock plate 337 is provided to regulate the movement of the second cover member 322 due to the pressure in the container body 311. As a result, the second lock plate 337 prevents the second cover member 322 from being moved. Thus, it is possible to prevent the second cover member 322 from being removed from the maintenance opening 321 due to the pressure in the container body 311.

Further, according to the exemplary embodiment, the container body 311 is provided with the fitting holes 323 and 325, and the second lock plate 337 is fitted into the fitting holes 323 and 325 to regulate the second cover member 322. Thus, the second cover member 322 may be removed from the maintenance opening 321 by removing the second lock plate 337 from the fitting holes 323 and 325. In this case, it is not necessary to perform a work such as, for example, removal of bolts, so that the maintenance work may be easily performed.

Furthermore, according to the exemplary embodiment, the second cover member 322 is connected with the first supply line 63 for supplying the processing fluid into the container body 311 via the supply port 313. Thus, when the second cover member 322 is removed from the maintenance opening 321, it is also possible to perform the maintenance work on a member for supplying the processing fluid such as, for example, the supply port 313.

Further, according to the exemplary embodiment, the maintenance opening 321 is provided at a position facing the conveyance port 312. Thus, when the pressure of the container body 311 is increased, stress is prevented from concentrating on a specific portion such as, for example, the maintenance opening 321. Therefore, the durability of the container body 311 may be enhanced.

Furthermore, according to the exemplary embodiment, the bottom surface of the container body 311 is connected with the second supply line 64 for supplying the processing fluid into the container body 311 via the bottom surface side fluid supply unit 341. Thus, the processing fluid may be supplied to the container body 311 from the rear side of the wafer W in an auxiliary manner. Therefore, the supply process of the processing fluid to the processing container 301 may be diversified. For example, the bottom surface side fluid supply unit 341 may be used when the processing fluid is supplied to the wafer W at a low flow rate, for example, at the start of the supply of the processing fluid to the processing container 301. In this case, it is possible to more reliably prevent the collapse of the pattern portion of the wafer W.

[Modification of Processing Container]

Next, a modification of the processing container 301 of the supercritical processing apparatus 3 will be described with reference to FIG. 9. FIG. 9 is a side view illustrating a modification of the processing container 301. In FIG. 9, the same parts as those of the exemplary embodiment illustrated in FIG. 1 to FIGS. 8A and 8B are denoted by the same reference numerals.

In FIG. 9, the processing container 301 is placed on a chamber base 402, and the chamber base 402 is disposed above a main base 401 to be spaced apart from the main base 401. The main base 401 is a reference material for installing the processing container 301. For example, the main base 401 is fixed horizontally within the cleaning processing system 1. A plurality of level adjustment mechanisms 403, 404 are provided between the main base 401 and the chamber base 402. These level adjustment mechanisms 403, 404 fine-adjust the position level (angle and height position) of the processing container 301 and the chamber base 402 with respect to the main base 401, and include a first level adjustment mechanism 403 positioned below the processing container 301 and a second level adjustment mechanism 404 positioned away from the processing container 301 in the planar direction. Among them, the first level adjustment mechanism 403 mainly supports the processing container 301, which is a heavy object, and adjusts its position in the height direction. The first level adjustment mechanism 403 has a higher load resistance than that of the second level adjustment mechanism 404. Although only one first level adjustment mechanism 403 is illustrated in FIG. 9, a plurality of first level adjustment mechanisms 403 may be provided. In addition, the second level adjustment mechanism 404 adjusts the level of the entire chamber base 402. In FIG. 9, four second level adjustment mechanisms 404 are illustrated, but the number of second level adjustment mechanisms 404 is not limited thereto.

Further, in FIG. 9, the container body 311 of the processing container 301 is formed as one block as a whole. In the container body 311, two heater openings 411 are formed on each of the upper and lower sides of the processing space 319. Each of the heater openings 411 is elongated along the longitudinal direction of the conveyance port 312 (the direction perpendicular to the paper surface of FIG. 9). Each of the heater openings 411 has an elongated heater block 412 loosely inserted therein. That is, the cross-sectional shape perpendicular to the longitudinal direction of the heater block 412 is formed slightly smaller than the heater opening 411, so that the heater block 412 may be inserted and removed with respect to the heater opening 411. Each heater block 412 is provided with an elongated heater 345 made of, for example, a resistance heating element. Heat from the heater 345 is transmitted to the container body 311 via the heater block 412. Each heater block 412 may be formed of a metal having good thermal conductivity (e.g., aluminum).

A plurality of tap holes 414 are formed through the top surface of the container body 311, and press fitting members 413 (e.g., bolts or screws) are screwed to each tap hole 414. Then, as each press fitting member 413 is screwed into the tap hole 414, the tip of the press fitting member 413 presses the heater block 412 downwardly. Thus, the heater block 412 is fixed so as not to move with respect to the container body 311. In this case, even when the position of the heater block 412 slightly deviates in the longitudinal direction of the heater block 412 (the direction perpendicular to the paper surface of FIG. 9), the heater block 412 may be securely fixed to the container body 311. In addition, since the heater block 412 is pressed downward, the lower surface of the heater block 412 is securely attached to the container body 311. Thus, the heat from the heater 345 may be efficiently transmitted to the container body 311. Although not illustrated, the configuration on the bottom surface of the container body 311 is also substantially the same as described above. That is, a plurality of tap holes are formed through the bottom surface of the container body 311, and the heater blocks 412 are pressed upward by the press fitting members that are screwed into the respective tap holes.

Figure 10:
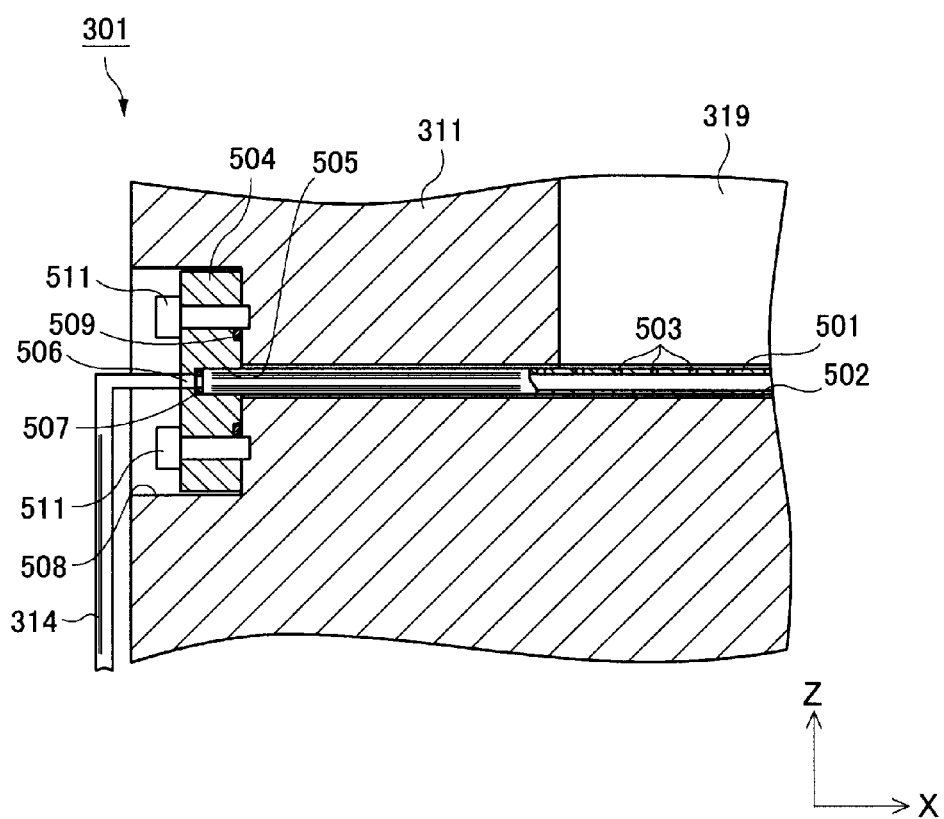
FIG. 10 is a cross-sectional view illustrating the periphery of the fluid discharge unit for discharging the fluid in the container body in a modification of the processing container of the supercritical processing apparatus.

Next, another modification of the processing container 301 of the supercritical processing apparatus 3 will be described with reference to FIG. 10. FIG. 10 is a cross-sectional view illustrating another modification of the processing container 301. In FIG. 10, the same parts as those of the exemplary embodiment illustrated in FIG. 1 to FIGS. 8A and 8B are denoted by the same reference numerals.

In FIG. 10, a fluid discharge pipe 501 is provided on the conveyance port 312 side in the container body 311 in place of the fluid discharge header 318 (see FIGS. 2 and 3). In this case, the fluid discharge pipe 501 is formed of a substantially cylindrical member. Further, an elongated accommodation groove 502 is formed in the bottom surface of the processing space 319 in the periphery of the conveyance port 312 along the longitudinal direction (X direction) of the conveyance port 312. The fluid discharge pipe 501 is detachably accommodated in the accommodation groove 502. In the fluid discharge pipe 501, a plurality of apertures 503 are provided at substantially equal intervals along the longitudinal direction. The fluid discharge pipe 501 functions as a fluid discharge unit that discharges the fluid in the container body 311, and the fluid in the process space 319 is discharged to the outside of the container body 311 through the apertures 503.

Circular fixing rings 504 are attached to both ends of the fluid discharge pipe 501. In FIG. 10, only one fixed ring 504 is illustrated. A fitting hole 505 is formed in a surface of the fixing ring 504 facing the container body 311 side, and the fitting hole 505 is in communication with an outer opening 506. One end of the fluid discharge pipe 501 is inserted into the fitting hole 505, and the fluid discharge pipe 501 and the outer opening 506 are brought into hermetically close contact with each other by a packing 507 disposed in the fitting hole 505. Further, in the periphery of the outer opening 506, the discharge port 314 is fixed to the fixing ring 504 by, for example, welding. Thus, the fluid from the processing space 319 is discharged to the outside sequentially through the fluid discharge pipe 501, the fitting hole 505, the outer opening 506, and the discharge port 314.

Each fixing ring 504 is accommodated in a recessed portion 508 formed on a side surface of the container body 311 and is fixed to the container body 311 by a fitting member 511 (e.g., a bolt). In addition, a packing 509 is fitted onto a surface of the fixing ring 504 on the container body 311 side, and the fixing ring 504 and the container body 311 are brought into hermetically close contact with each other by the packing 509.

In FIG. 10, the fluid discharge pipe 501 may be removed from the container body 311 by removing the fixing ring 504 from the container body 311. Thus, the cleaning work or a replacement work of the fluid discharge pipe 501 may be easily performed. In addition, the apertures 503 of the fluid discharge pipe 501 may be easily formed.

For example, the processing fluid used for the drying processing may be a fluid other than $CO_2$, and an arbitrary fluid capable of removing the drying prevention liquid filled in the recesses of the substrate in the supercritical state may be used as a processing fluid. Further, the drying prevention liquid is not limited to IPA, and any liquid available as a drying prevention liquid may be used.

Further, in the above descriptions, the maintenance opening 321 has the same size as that of the opening of the conveyance port 312. However, the size and shape of the maintenance opening 321 are not limited thereto. The maintenance opening 321 may have, for example, a size or a shape capable of taking out the wafers W accommodated in the container body 311, or a size or a shape capable of taking out fragments of a broken wafer W. In addition, the maintenance opening 321 may have a size or a shape that allows the maintenance work (e.g., cleaning or adjustment) to be performed inside the processing space 319 by inserting, for example, a cleaning jig or a tool.

In addition, in the exemplary embodiments and the modifications described above, the present disclosure is applied to the substrate processing apparatus and the substrate processing method, but the application target of the present disclosure is not particularly limited. For example, the present disclosure may also be applied to a program for causing a computer to execute the above-described substrate processing method, and a computer readable non-transitory recording medium in which such a program is recorded.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a container body configured to accommodate a substrate and perform a processing on the substrate using a high-pressure processing fluid;
    a conveyance port formed in the container body and configured to carry the substrate into and out of the container body;
    an opening formed in the container body at a position different from the conveyance port;
    a cover configured to close the opening; and
    a lock plate configured to lock a position of the cover;
    wherein the container body includes a fitting hole adjacent the opening configured to allow the lock plate to be fitted into the fitting hole so as to lock the position of the cover to regulate movement of the cover due to a pressure in the container body.

2. The substrate processing apparatus of claim 1, further comprising:
    a seal formed between the cover and the container body.

3. The substrate processing apparatus of claim 1, further comprising:
    a lift to regulate movement lock plate.

4. The substrate processing apparatus of claim 1, wherein a first supply line is connected to the cover to supply the processing fluid into the container body.

5. The substrate processing apparatus of claim 1, wherein the opening is provided at a position facing the conveyance port.

6. The substrate processing apparatus of claim 1, wherein a second supply line is connected to a bottom surface of the container body to supply the processing fluid into the container body.

7. A substrate processing apparatus comprising:
    a container body configured to accommodate a substrate and perform a processing on the substrate using a high-pressure processing fluid;
    a conveyance port formed in the container body and configured to carry the substrate into and out of the container body;

an opening formed in the container body at a position different from the conveyance port;
a first cover configured to close the conveyance port;
a second cover configured to close the opening;
a first regulator configured to regulate movement of the first cover due to a pressure in the container body; and
a second regulator configured to regulate movement of the second cover due to the pressure in the container body.

8. The substrate processing apparatus of claim 7, wherein the container body is provided with a first fitting hole, and the first regulator regulates the movement of the first cover by being fitted into the first fitting hole.

9. The substrate processing apparatus of claim 8, wherein the container body is provided with a second fitting hole, and the second regulation member regulates the movement of the second cover by being fitted into the second fitting hole.

10. The substrate processing apparatus of claim 7, wherein a first supply line is connected to the second cover member to supply the processing fluid into the container body.

11. The substrate processing apparatus of claim 7, wherein the opening is provided at a position facing the conveyance port.

12. The substrate processing apparatus of claim 7, wherein a second supply line is connected to a bottom surface of the container body to supply the processing fluid into the container body.

* * * * *